(12) United States Patent  (10) Patent No.: US 8,363,205 B2
Iwasaki  (45) Date of Patent: Jan. 29, 2013

(54) EXPOSURE APPARATUS

(75) Inventor: Yuichi Iwasaki, Utsunomiya (JP)

(73) Assignee: Canon Kabishiki Kaisha (JP)

( * ) Notice: Subject to any disclaimer, the term of this patent is extended or adjusted under 35 U.S.C. 154(b) by 561 days.

(21) Appl. No.: 12/161,222

(22) PCT Filed: Jan. 18, 2007

(86) PCT No.: PCT/JP2007/050659
§ 371 (c)(1),
(2), (4) Date: Jun. 15, 2010

(87) PCT Pub. No.: WO2007/083686
PCT Pub. Date: Jul. 26, 2007

(65) Prior Publication Data
US 2010/0245789 A1 Sep. 30, 2010

(30) Foreign Application Priority Data
Jan. 18, 2006 (JP) ................................. 2006-010147

(51) Int. Cl.
G03B 27/52 (2006.01)
G03B 27/42 (2006.01)
(52) U.S. Cl. .......................................... 355/30; 355/53
(58) Field of Classification Search ............... 355/30, 355/53, 72
See application file for complete search history.

(56) References Cited

U.S. PATENT DOCUMENTS 7,742,147 B2 * 6/2010 Chibana ........................ 355/30
2005/0161644 A1 7/2005 Zhang et al.
2005/0173682 A1 8/2005 Zhang et al.
2006/0012765 A1 1/2006 Kameyama

FOREIGN PATENT DOCUMENTS

| EP | 1557721 A2 | 7/2005 |
| EP | 1610361 A1 | 12/2005 |
| JP | 2005-183744 A | 7/2005 |
| JP | 2005-252239 A | 9/2005 |
| WO | 2004/086470 A1 | 10/2004 |

OTHER PUBLICATIONS

International Search Report issued on Apr. 24, 2007 for International Application No. PCT/JP2007/050659.
International Preliminary Report issued on Apr. 14, 2008 for International Application No. PCT/JP2007/050659.

* cited by examiner

Primary Examiner — Peter B Kim
(74) Attorney, Agent, or Firm — Rossi, Kimms & McDowell, LLP

(57) ABSTRACT

An exposure apparatus (1) configured to expose a pattern of a reticle (20) via a liquid (LW) filled between a final lens of a projection optical system (30) and a substrate (40) includes a stage (45) configured to drive the substrate, a shield (81) configured to enclose the stage so as to form a shield space (SS) around the stage, the shield having an opening for an import or an export of the substrate, and a unit, such as a load lock chamber (83), configured to prevent a vapor of the liquid to going out of the shield space and to reduce an outflow amount of the vapor.

5 Claims, 4 Drawing Sheets

EXPOSURE APPARATUS

TECHNICAL FIELD

The present invention relates generally to an exposure apparatus, and a so-called immersion exposure apparatus configured to locally fill a liquid in a space between a final surface (final lens) of a projection optical system and surface of a substrate, such as a wafer, and to expose the substrate via the projection optical system and the liquid.

BACKGROUND ART

A projection exposure apparatus configured to expose a circuit pattern of a reticle (mask) onto a wafer via a projection optical system has conventionally been known, and a high resolution exposure apparatus is increasingly required.

An immersion exposure calls attentions as one measure to meet the demand for the high resolution. The immersion exposure further promote an increase of a numerical aperture ("NA") of a projection optical system by using a liquid (immersion liquid) as a medium at the wafer side of the projection optical system. Since the NA of the projection optical system is defined as $NA=n \times \sin\theta$ where n is a refractive index of the medium, NA can be increased up to n by using a medium having a refractive index higher than that of air (n>1) between the projection optical system and the wafer. By so doing, the resolution R of the exposure apparatus, which is expressed as $R=k1 \times (\lambda/NA)$ with a wavelength $\lambda$ of a light source and a process constant k1.

In the immersion exposure, a local fill system that locally fills a liquid in a space between the final surface and the wafer is proposed (see, for example, a Patent Document 1).
Patent Document 1: Japanese Domestic Publication No. 2004-086470.

DISCLOSURE OF THE INVENTION

However, in the immersion exposure apparatus, the liquid vaporizes, diffuses, adheres to the optical system surface, and may deteriorate an optical image. In addition, a vapor of a diffused immersion liquid flows out and contaminates a clean room environment. On the other hand, the Patent Document 1 provides an enclosure that prevents a diffusion of a vapor of the immersion liquid around a wafer stage. However, the enclosure needs an opening through which the wafer is imported and exported, and the vapor of the immersion liquid may diffuse to the outside of the enclosure through the opening.

The present invention provides an immersion exposure apparatus that can prevent or reduce a diffusion of a vapor of the liquid.

An exposure apparatus according to one aspect of the present invention is configured to fill a liquid in a space between a final lens of a projection optical system and a substrate, and to expose a pattern of a reticle onto a substrate via the liquid. The exposure apparatus includes a stage configured to drive the substrate, a shield configured to enclose the stage so as to form a shield space around the stage, the shield having an opening for an import and an export of the substrate, and a unit configured to prevent an outflow of a vapor of the liquid to outside of the shield space and to reduce an outflow amount of the vapor.

A device manufacturing method according to another aspect of the present invention includes the steps of exposing a substrate using the above exposure apparatus, and developing the exposed substrate.

Further features of the present invention will become apparent from the following description of exemplary embodiments with reference to the attached drawings.

BEST MODE TO IMPLEMENT THE INVENTION

Referring now to the accompanying drawings, a description will be given of an exposure apparatus 1 as one aspect of the present invention.

First Embodiment

Figure 1:
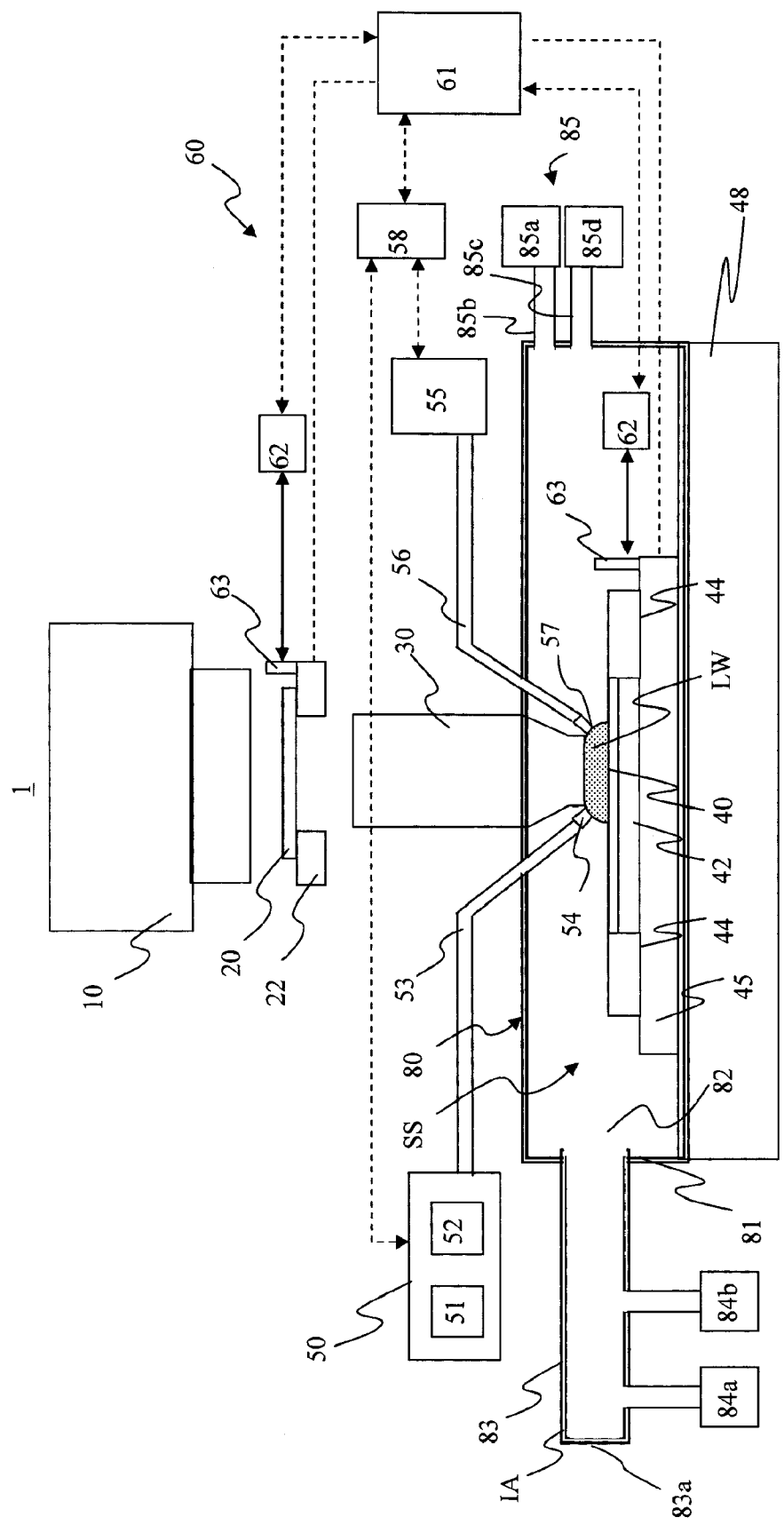
FIG. 1 is a schematic sectional view of a structure of an exposure apparatus according to a first embodiment of the present invention.

FIG. 1 is a schematic plane view showing a structure of the exposure apparatus 1 according to a first embodiment of the present invention. The exposure apparatus 1 is an immersion type projection exposure apparatus (immersion exposure apparatus) configured to expose a circuit pattern of a reticle 20 onto a substrate via a liquid (immersion liquid) LW supplied to a space between a final lens of a projection optical system 30 and a wafer 40 in a so-called a step-and-scan manner. The exposure apparatus 1 is applicable to a step-and-repeat manner.

The exposure apparatus 1 includes, as shown in FIG. 1, an illumination apparatus 10, a reticle stage 22 mounted with a reticle 20, a projection optical system 30, a wafer stage 45 mounted with a wafer 40, a liquid supply and collection part, a stage control system 60, and a diffusion preventive unit 80.

The illumination apparatus 10 illuminates a reticle 20 that has a circuit pattern to be transferred, and includes a light source section and an illumination optical system. The light source section of this embodiment uses an ArF excimer laser having a wavelength of about 193 nm for a light source. However, the light source section is not limited to the ArF excimer layer, and may use a KrF excimer layer having a wavelength of about 248 nm, or a $F_2$ laser having a wavelength of about 157 nm. The illumination optical system is an optical system that illuminates the reticle 20 with the light from the light source.

The reticle 20 is carried from the outside of the exposure apparatus 1 by a reticle carrying system (not shown), and is supported and driven by the reticle stage 22. The reticle 20 is made, for example, of quartz, and has a circuit pattern to be transferred. The diffraction light emitted from the reticle 20 is projected on the wafer 40 via the projection optical system 30. The reticle 20 and the wafer 40 are arranged in an optically conjugate relationship. The exposure apparatus 1 is a scanner, and thus the pattern of the reticle 20 is transferred onto the wafer 40 by scanning the retile 20 and the wafer 40 at a speed ratio of a demagnification ratio.

The reticle stage 22 is attached to a stool (not shown) configured to fix the reticle stage 22. The reticle stage 22 supports the reticle 20 via a reticle chuck (not shown), and a moving mechanism (not shown) and the stage control system 60 control movements of the reticle stage 22. The moving mechanism (not shown) includes a linear motor, etc., and can move the reticle 20 by driving the reticle stage 22 in a scanning direction.

The projection optical system 30 serves to image the diffracted light that has passed the pattern of the reticle 20, onto the wafer 40. The projection optical system 30 can use a dioptric optical system that includes only plural lens elements, a catadioptric optical system that includes plural lenses and at least one concave mirror, etc.

The wafer 40 is carried from the outside of the exposure apparatus 1 by a wafer carrying system (not shown), and supported and driven by the wafer stage 45. The wafer 40 is a substrate (object to be exposed), and covers a liquid crystal substrate and another substrate in another embodiment. A photoresist is applied to the wafer 40.

A leveling plate 44 is a plate configured to level a surface of the wafer 40 supported by the wafer stage 45, with an outside area of the wafer 40 (wafer stage 45), and is approximately as high as the wafer 40. In general, the leveling plate 44 is used for the immersion exposure, and enables a liquid film to be formed even outside area of the wafer 40.

The wafer stage 45 is attached to a stage stool 48 configured to fix the wafer stage 45, and supports the wafer 40 via a wafer chuck 42.

The liquid supply and collection part includes a liquid supply part 50, a liquid collection part 55, and an immersion controller 58.

The liquid supply part 50 supplies the liquid LW to a space or gap between the projection optical system 30 and the wafer 40. The liquid supply part 50 may serve to supply a gas so as to form a gas curtain configured to enclose (hold) the liquid around the liquid LW.

When the liquid is pure water, the gas for this curtain is preferably air. When the liquid is an organic liquid, the gas for this curtain can be nitrogen, an inert gas, or a mixture gas of them. This inert gas is preferably argon.

A structure that forms the gas curtain is described in Japanese Patent Laid-Open No. 2004-289126, and a detailed description thereof will be omitted.

The liquid supply part 50 of this embodiment includes a generator (not shown), a tank that stores the liquid LW, a compressor that feeds out the liquid LW, and a flow controller that controls a supply flow amount of the liquid LW, a deaerator 51 of a dissolved gas that dissolves in the liquid LW, a temperature controller 52, and a liquid supply pipe 53. The liquid supply part 50 supplies the liquid LW via a liquid supply port 54 that is arranged around the final surface of the projection optical system 30, and forms a film of the liquid LW in the space between the projection optical system 30 and the wafer 40. The space between the projection optical system 30 and the wafer 40 can be so thick that the film of the liquid LW can be preferably formed stably and removed, and the thickness may be, for example, 1.0 mm.

The liquid LW can be selected from among types that are less likely to absorb the exposure light, and preferably has a refractive index greater than that of a dioptric optical element, such as quartz and calcium fluoride. This embodiment uses a flammable organic liquid for the liquid LW, but the present invention is not limited to this embodiment, and may use pure water and another liquid.

The organic liquid has a refractive index greater than that of pure water, and can use a liquid described in Japanese Patent Laid-Open No. 2006-313905.

Preferably, the dissolved gas may previously be removed sufficiently from the liquid LW by using the deaerator 52, because such a liquid LW can restrain generations of gas bubbles or immediately absorb in the liquid any generated gas bubbles. For example, when 80% of a gas amount dissolvable in the liquid LW is eliminated with respect to nitrogen and oxygen that occupy most part in air, generations of gas bubbles can be sufficiently restrained. Since oxygen absorbs the light of 193 nm, and the liquid LW that sufficiently removes oxygen is indispensable. Of course, the exposure apparatus 1 has the deaerator 51, and supplies the liquid LW while always removing the dissolved gas from the liquid LW.

The generator reduces impurities, such as metallic ions, fine particles, and organic matters contained in a raw liquid that is supplied form a raw liquid supply source (not shown), and generates the liquid LW. The liquid LW generated by the generator is supplied to the deaerator 51.

The deaerator 51 deaerates the liquid LW, and reduces the dissolved oxygen and dissolved nitrogen in the liquid LW. The deaerator 51 includes, for example, a film module and a vacuum pump. The deaerator 51 can use, for example, a unit in which the liquid LW is supplied to one side of a gas transmitting film and the other side of the gas transmitting film is maintained vacuum, so as to expel the dissolved gas from the liquid LW into the vacuum side via the film.

The temperature controller 52 serves to control a temperature of the liquid LW to a predetermined temperature.

The liquid supply pipe 53 supplies the liquid LW that is deaerated by the deaerator 51 and temperature-controlled by the temperature controller 52, to the space between the projection optical system 30 and the wafer 40 via the liquid supply port 54.

The liquid collection part 55 serves to collect the liquid LW supplied by the liquid supply part 50, and includes a liquid collection pipe 56, a tank that temporarily stores the collected liquid LW, and a flow controller that controls a collection flow amount of the liquid LW in this embodiment. The liquid correction pipe 56 collects the liquid LW via a liquid collection port 57.

The liquid supply port 54 and the liquid collection port 56 are formed in a member adjacent to the projection optical system 30, and oppose to the wafer 40. In this embodiment, the liquid supply port is closer to an optical axis of the projection optical system 30 than the liquid collection port 56. The liquid supply port 54 and the liquid collection port 56 may be an embedded porous member, such as an inorganic material, or a slit-shaped opening.

The liquid supply pipe 53 and the liquid collection pipe 56 are preferably made of resin, such as polytetrafluoroethylene (PTFE) resin, so that the dissolved material is less likely occur or contaminate the liquid LW.

The immersion controller 58 controls the liquid supply part 50 and the liquid collection part 55, and communicates with the stage controller 61, which will be described later. The immersion controller 58 receives from the stage controller 61 information, such as a current position, speed, acceleration, a target position, and a moving direction of the wafer stage 45, and provides a control command, such as a start and a stop of the immersion, and a flow amount, to the liquid supply part 50 and the liquid collection part 55 based on the information.

The stage control system 60 is a controller that controls movements of the reticle stage 22 and the wafer stage 45, and includes the stage controller 61, a pair of laser interferometers 62, and a pair of reference mirrors 63. The reticle stage 22 and the wafer stage 45 are mounted with each of the pair of reference mirrors 63. Each of the pair of laser interferometers 62 is optically connected to a corresponding reference mirror.

The reticle 20 and the wafer 40 are synchronously scanned, and two-dimensional positions of the reticle stage 22 and the wafer stage 45 are measured on a real-time basis by the pair of reference mirrors 63 and the laser interferometers 62. The stage controller 61 performs positioning and synchronous controls of the reticle stage 22 and the wafer stage 45 based on the measurement values, and both members are driven at a constant speed ratio. The wafer stage 45 includes a driving unit (not shown) that adjusts, varies or controls a position in a vertical direction, a rotational direction, and an inclination. During exposure, the driving unit controls the wafer stage 45 so that a focal plane of the projection optical system 30 can highly precisely accord with the exposure area on the wafer 40. Here, a position on a surface of the wafer 40 (a vertical position and an inclination) is measured by a focus sensor (not shown), and supplied to the stage controller 61.

The body of the exposure apparatus 1 is installed in a chamber (not shown), and the environment of the body of the exposure apparatus 1 is maintained at a predetermined temperature. The space of the reticle stage 22, the wafer stage 45, the interferometer 62, and the space of the projection optical system 30 are supplied with individually temperature-controlled air so as to highly precisely maintain the environmental temperature.

The diffusion preventive apparatus 80 prevents diffusions of vapors of the liquid LW from the wafer 40, the leveling plate 44, and the wafer stage 45. The diffusion preventive apparatus 80 is a unit that prevents an outflow of a vapor of the liquid to the outside of the shield space through the opening of the shield or reduces an outflow amount of the vapor to the outside. Thereby, the diffusion preventive apparatus 80 shields contacts between the vaporized liquid LW and an optical system (such as the illumination optical system and the projection optical system), an ignition source (such as the moving mechanism of the reticle stage 22) or a worker, and can maintain the optical characteristic and improve safety.

The diffusion preventive apparatus 80 includes a shield, an outflow preventive means, and a temperature controller 85.

The shield encloses the wafer stage 45, forms a shield space SS around the wafer stage 45, and is made of a diaphragm member 81 in this embodiment. The shield space SS is also an exposure space or a processing space in which the wafer 40 is exposed. The shield space SS is formed by the diaphragm member 81 of the diffusion preventive unit 80, and has a size that covers a moving range of the stage on the stage stool 48. A barrel of the projection optical system 30 and the supply pipe 53 and the collection pipe 56 are provided as ceiling members, and an airtight process is performed so that a vapor of the immersion liquid does not diffuse from these openings. This structure can limit a vapor of the immersion liquid LW to the shield space SS without interference between the wafer stage 45 and the diaphragm member 81. The ceiling diaphragm member may use the barrel (not shown). Since the laser interferometer 62 and the reference mirror 63 are also provided in the shield space SS, a position measurement error caused by fluctuations of the vapor of the immersion liquid is small.

The diffusion preventive unit prevents an outflow of a vapor of the liquid LW to the outside of the shield space SS through the gate valve 82 that is formed in the shield and used for an import and an export of the wafer 40. This embodiment forms the outflow preventive means as a load lock chamber 83. The load lock chamber 83 is located between the shield space SS and a port (not shown) that is used to accommodate the wafer 40. The load lock chamber 83 receives the wafer 40 from the port, supplies it to the shield space SS, and converts an internal atmosphere IA. The load lock chamber 83 has a gas supplier 84a, and a gas collector 84b.

In importing the wafer 40, the gas supplier 84a supplies nitrogen, for example, and the gas collector 84b collects nitrogen and purges the interior the load lock chamber 83 with nitrogen. Thereafter, a door 83a as a connecting part with the port is opened, the wafer 40 is inserted into the load lock chamber 83, and the door is closed. The interior of the load lock chamber 83 is again maintained in a nitrogen atmosphere using the gas supplier 84a and the gas collector 84b. Thereafter, the gate valve 82 is opened and the wafer 40 is fed in on the chuck 42.

In exporting the wafer 40, the gate valve 82 is opened, and the wafer 40 that has been exposed is fed in the load lock chamber 83. Next, the gate valve 82 is closed, and the interior of the load lock chamber is purged with nitrogen to replace a gas that contains an organic solvent vapor with nitrogen. Next, the door 83a is opened, and the wafer 40 is exported. A series of these actions prevents outflows of vapors of the immersion liquid LW to the outside of the shield space SS. A gas that replaces the load lock chamber 83 can use an inert gas. The gas collector 84b has a unit configured to remove a vapor of the immersion liquid LW, such as an absorption filter (not shown). Such a unit can prevent environmental contaminations. In addition, in order to secure the productivity of the exposure apparatus 1, the load lock chamber 83 is preferably configured to simultaneously perform an import and an export of the wafer 40.

A temperature rise is presumed in the shield space SS due to the heats from the stage driving unit. The temperature controller 85 serves to maintain a temperature of the shield SS to a predetermined temperature. The temperature controller 85 of this embodiment introduces a temperature controlled inert gas, such as nitrogen, to the shield space SS, maintains the temperature of the shield space SS to the predetermined temperature, and includes a gas supply part and a gas collection part. The gas supply part has a supplier 85a configured to supply a temperature controlled gas, and a supply pipe 85b configured to introduce the gas from the supplier 85a to the shield space SS. The gas collection part includes a collector 85c configured to collect the gas, and a collection pipe 85d configured to introduce the gas from the shield space SS to the collector 85c. The collector 85d is incorporated with a unit that removes a vapor of the immersion liquid, such as an absorption filter (not shown), so as to prevent environmental contaminations. Such a unit can prevent environmental contaminations. A collection of the gas from the shield space SS may be performed through natural exhaustions. Alternatively, the collector 285d may be provided with a fan configured to absorb a gas, and controller (not shown) configured to control a gas flow amount between the supplier 85a and the collector 85d may be provided so as to flow a temperature-controlled and flow-controlled gas. This structure improves the temperature controllability, and the exposure precision.

Second Embodiment

Figure 2:
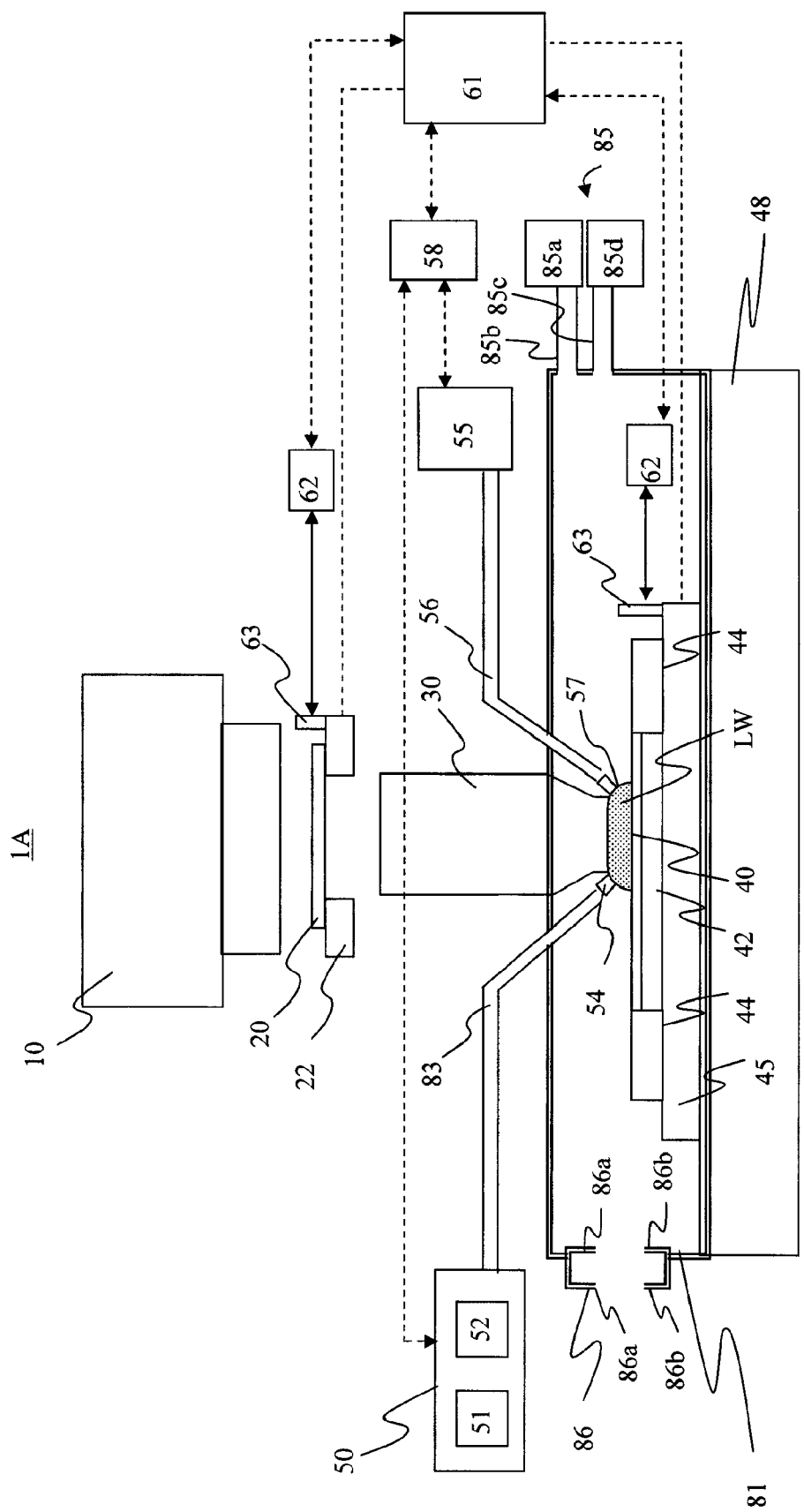
FIG. 2 is a schematic sectional view of a structure of an exposure apparatus according to a second embodiment of the present invention.

FIG. 2 is a schematic sectional view of an exposure apparatus 1A according to a second embodiment of the present invention. Those elements which are corresponding elements in the first embodiment are designated by the same reference numerals. The exposure apparatus 1A is different from the exposure apparatus 1 in that the diffusion preventive apparatus uses an air curtain forming means 86. The diffusion preventive apparatus is a unit that prevents outflows of vapors of the liquid via the opening in the shield to the outside of the shield space, or reduces an outflow amount of the vapor to the outside.

The air curtain forming means 86 forms an air curtain at an opening for an export and an import of the wafer 40. The air curtain system is expected to improve the productivity because it has a simpler mechanism than the diffusion preventive apparatus of the first embodiment and shortens the export and import time periods. Moreover, this system facilitates a miniaturization of the mechanism, and restrains the exposure apparatus 1 from being larger. A supply amount of the air curtain is controlled so as not to influence the gas supply and collection amounts of the temperature controller 85. Similar to the temperature controller 85, the air curtain can be provided with a controller (not shown) of a supply flow amount and a collection flow amount of a temperature-controlled gas. In addition, it is preferable to form double air curtains so as to improve the airtight performance of the shield space SS and to prevent diffusions of vapors of the immersion liquid. Therefore, the air curtain forming means 86 of this embodiment includes a pair of gas supply pipes 86*a*, and a pair of gas collection pipes 86*b*.

Third Embodiment

Figure 3:
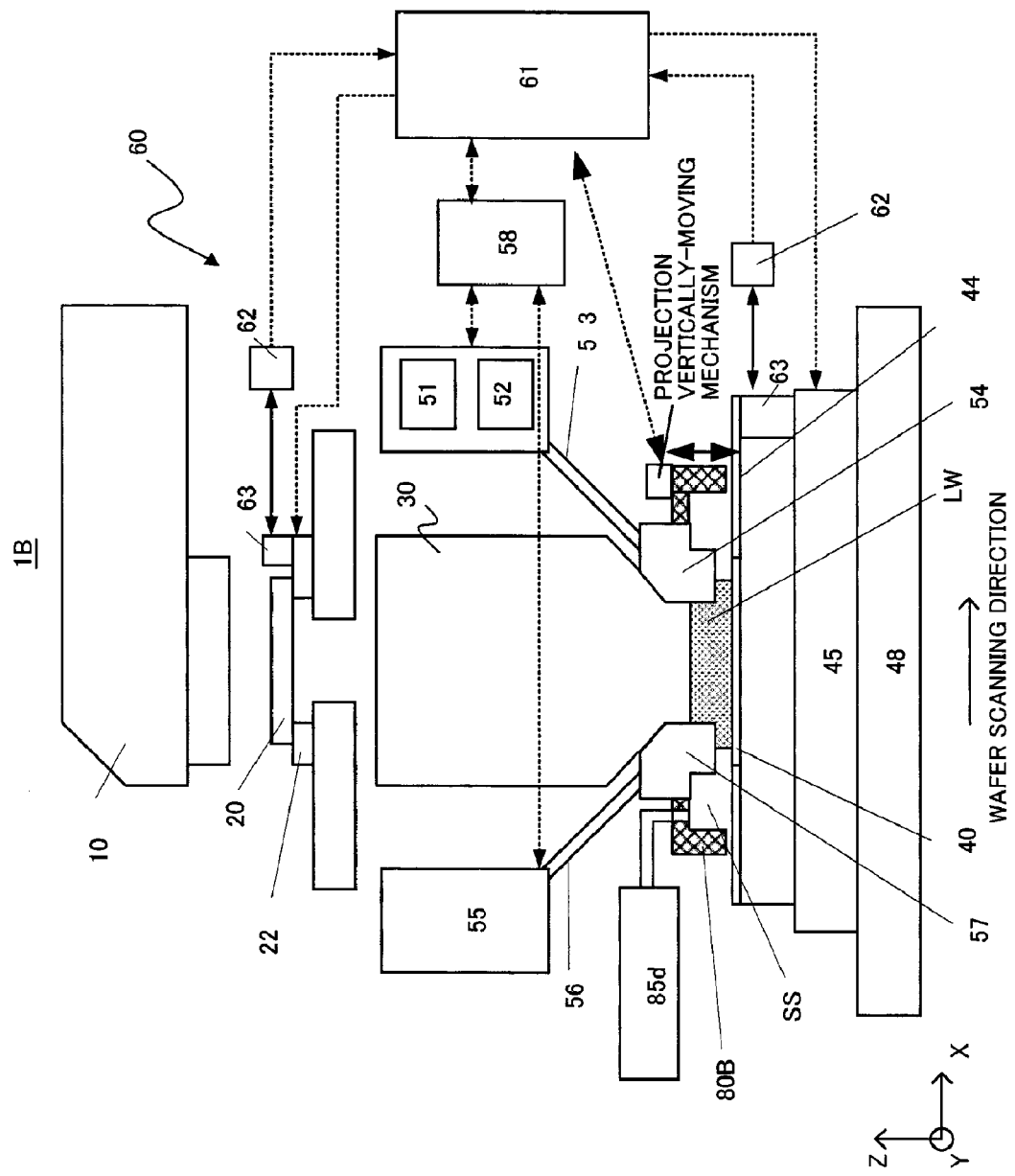
FIG. 3 is a schematic sectional view of a structure of an exposure apparatus according to a third embodiment of the present invention.

FIG. 3 is a schematic sectional view of an exposure apparatus 1B according to a third embodiment of the present invention. The exposure apparatus 1B arranges a diffusion preventive apparatus 80B at an outer circumference of the liquid supply port 54 and liquid collection port 57, and is configured to prevent a leakage of a vapor of the liquid LW to the outside of a periphery of a final lens of the projection optical system 30 (which is a lens closest to the wafer 40).

The diffusion preventive unit 80B is a ring-shaped projection provided on the outer circumference of the liquid supply port 54 and liquid collection port 57. The diffusion preventive unit 80B is designed to be distant from the wafer 40 or the leveling plate 44 by a fine gap (preferably 0.1 mm or smaller) so that the stage space can be approximately separated spatially from the shield space SS.

This spatial separation is designed to maintain in a moving range of the stage in the horizontal direction (or a moving range on a so-called XY plane). Therefore, in attaching the wafer to the stage and in detaching the wafer from the stage, both spaces are separated and a vapor of a liquid does not leak to the stage space or its leakage amount is insignificant.

In addition, the collector 85*d* is provided to the shield space SS formed by the diffusion preventive unit 80B for controls by which a vapor of the liquid LW is collected and by which the shield SS has a negative pressure relative to the outside stage space. Thereby, although the shield space SS is connected to the stage space through the fine gap, a gas flows in a direction from the stage space to the shield space SS, a vapor of the liquid LW does not leak to the stage space.

Moreover, a projection vertically-moving mechanism configured to vertically move the projection of the diffusion preventive apparatus 80B is provided so as to handle fluctuations of a position of the wafer stage 45 in the Z direction, etc. The projection vertically-moving mechanism is associated with the stage controller 61, the wafer stage 45, and the immersion controller 58, and vertically moves the projection when necessity arises.

A structure of the third embodiment is an exposure apparatus that fills the liquid in a space between the final lens of the projection optical system and the substrate, and exposes the pattern of the reticle onto the substrate. This exposure apparatus has a shield (projection) that encloses the liquid so as to form the shield space around the liquid. The shield maintains a small gap with the surface of the leveling plate and the wafer surface so as to prevent outflows of vapors of the liquid from the gap or to allow only an insignificant leakage amount of the outflow vapor. Preferably, this shield vertically moves.

Each structure of the first embodiment to third embodiment can prevent diffusions of or reduce a diffusion amount of vapors of the immersion liquid LW to the outside of the shield space SS in importing and exporting the wafer 40. As a result, an adhesion (contamination) of a vapor of the immersion liquid LW to an optical system can be prevented or reduced down to an insignificant level, and the exposure characteristic can be maintained. In particular, when the immersion liquid LW is flammable, the shield space SS can be separated from an ignition source of the reticle stage, and the safety improves. Moreover, a contamination to a clean room and the influence to the human body can be eliminated.

In the exposure apparatuses according to the first embodiment to third embodiment, the light emitted from the illumination apparatus 10, for example, Koehler-illuminates the reticle 20. The light that has passed the reticle 20 and reflects the reticle pattern is imaged on the wafer 40 via the projection optical system 30 and the liquid LW. This exposure apparatus 1 prevents a diffusion of a vapor of the liquid LW, a lowered throughput, and a deterioration of an exposure precision, maintains the safety, and provides a device (such as a semiconductor device, an LCD device, an image sensor (CCD), and a thin-film magnetic head).

Figure 4:
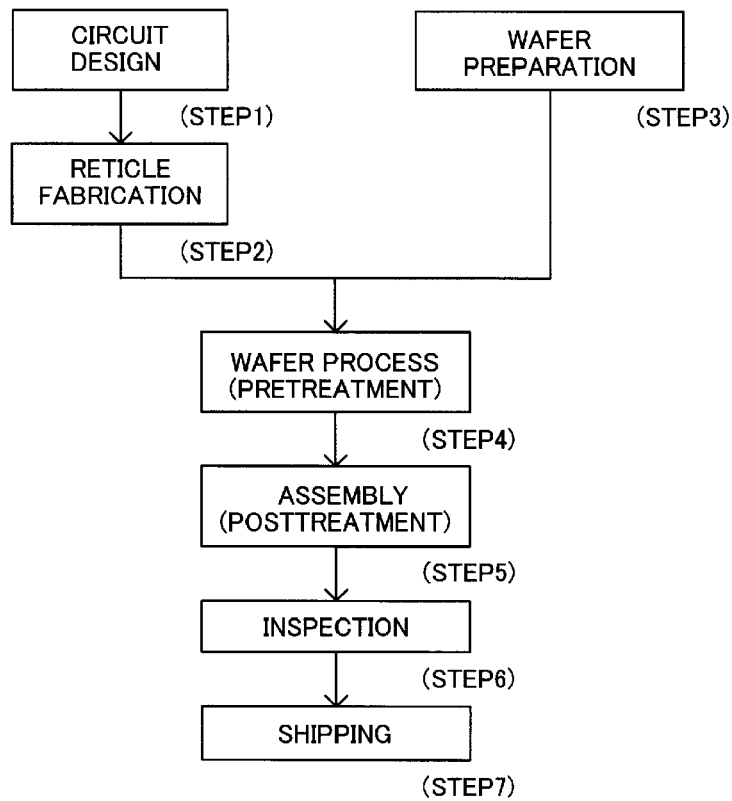
FIG. 4 is a flowchart for explaining a manufacture of a device, such as a semiconductor chip (such as an IC and an LSI), an LCD, and a CCD.
Figure 5:
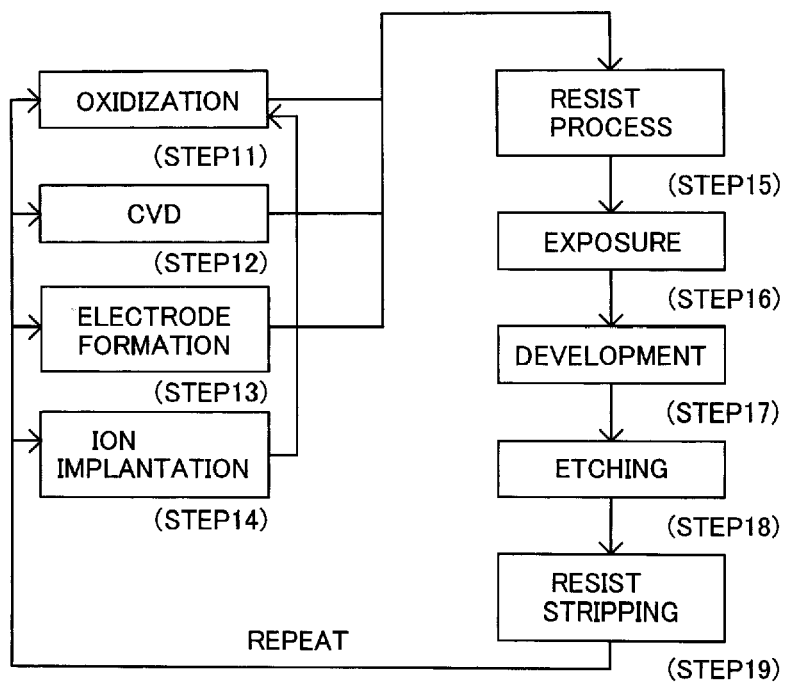
FIG. 5 is a detailed flowchart of a wafer process of step 4 shown in FIG. 4.

Referring to FIGS. 4 and 5, a description will now be given of an embodiment of a device manufacturing method using the above exposure apparatus 1. FIG. 4 is a flowchart for explaining manufactures of devices (i.e., semiconductor chips such as IC and LSI, LCDs, CCDs, etc.). Here, a description will be given of a manufacture of a semiconductor chip in an example. Step 1 (circuit design) designs a semiconductor device circuit. Step 2 (reticle fabrication) forms a reticle having a designed circuit pattern. Step 3 (wafer preparation) manufactures a wafer using a material such as silicon. Step 4 (wafer process), which is also referred to as a pretreatment, forms actual circuitry on the wafer through the lithography technology of the present invention using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes a wafer's surface. Step 12 (CVD) forms an insulating film on the wafer's surface. Step 13 (electrode formation) forms an electrode on the wafer by vapor disposition and the like. Step 14 (ion implantation) implants ions into the wafer. Step 15 (resist process) applies a photosensitive material to the wafer. Step (exposure) uses the exposure apparatus 1 to expose a circuit pattern on the reticle onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. The device manufacturing method of this embodiment may manufacture higher quality devices than the conventional one. Thus, the device manufacturing method using the exposure apparatus 1, and the devices as resultant products also constitute one aspect of the present invention.

While the present invention has been described with reference to preferred embodiments, it is to be understood that the invention is not limited to the embodiments. The scope of the following claims is to be accorded the broadest interpretation so as to encompass all such modifications and equivalent structures and functions.

INDUSTRIAL APPLICABILITY

The present invention can provide an immersion exposure apparatus that can safely use a flammable immersion material.

What is claimed is:

1. An exposure apparatus configured to expose a substrate via a liquid, said exposure apparatus comprising:
    a projection optical system configured to project an image of a pattern of a reticle onto the substrate;
    a stage configured to drive the substrate;
    a liquid supply part configured to supply the liquid to a space between the projection optical system and the substrate;
    a liquid collection part configured to collect the liquid from the space between the projection optical system and the substrate;
    a projection provided to an outer circumference of a liquid supply port of the liquid supply part or a liquid collection port of the liquid supply part, and configured to form a shield space around the liquid in cooperation with the substrate or a leveling plate arranged at an outer circumference of the substrate; and
    a collection unit configured to collect a vapor of the liquid from the shield space and to maintain the shield space to have a negative pressure relative to outside of the shield space.

2. The exposure apparatus according to claim 1, wherein the liquid has a refractive index greater than that of water.

3. The exposure apparatus according to claim 2, wherein the liquid is a flammable organic liquid.

4. A device manufacturing method comprising the steps of:
    exposing a substrate using an exposure apparatus according to claim 1; and
    developing the substrate that has been exposed.

5. The exposure apparatus according to claim 1, further comprising a projection vertically-moving mechanism configured to vertically move the projection.

* * * * *

UNITED STATES PATENT AND TRADEMARK OFFICE
CERTIFICATE OF CORRECTION

PATENT NO.       : 8,363,205 B2
APPLICATION NO.  : 12/161222
DATED            : January 29, 2013
INVENTOR(S)      : Yuichi Iwasaki It is certified that error appears in the above-identified patent and that said Letters Patent is hereby corrected as shown below:

Title Page

In the Assignee item (73), the Assignee should read CANON KABUSHIKI KAISHA, please correct as follows:

In item 73 for Assignee: REMOVE: "CANON KABISHIKI KAISHA"
TO READ: --CANON KABUSHIKI KAISHA--

Signed and Sealed this
Twenty-third Day of April, 2013

Teresa Stanek Rea
*Acting Director of the United States Patent and Trademark Office*